United States Patent
Stuyt et al.

(10) Patent No.: US 8,327,309 B2
(45) Date of Patent: Dec. 4, 2012

(54) VERIFICATION OF DESIGN INFORMATION FOR CONTROLLING MANUFACTURE OF A SYSTEM ON A CHIP

(75) Inventors: Jan Stuyt, Waalre (NL); Bernard W. De Ruyter, Geldrop (NL); Roelof P. De Jong, Eindhoven (NL); Pieter Struik, Nuenen (NL); Joris H. J. Geurts, Eindhoven (NL)

(73) Assignee: Synopsys, Inc., Mountain View, CA (US)

( * ) Notice: Subject to any disclaimer, the term of this patent is extended or adjusted under 35 U.S.C. 154(b) by 2 days.

(21) Appl. No.: 12/673,445

(22) PCT Filed: Aug. 8, 2008

(86) PCT No.: PCT/IB2008/053194
§ 371 (c)(1),
(2), (4) Date: Jan. 26, 2011

(87) PCT Pub. No.: WO2009/022276
PCT Pub. Date: Feb. 19, 2009

(65) Prior Publication Data
US 2011/0239067 A1 Sep. 29, 2011

(30) Foreign Application Priority Data
Aug. 14, 2007 (EP) .................................. 07114296

(51) Int. Cl.
*G06F 17/50* (2006.01)
(52) U.S. Cl. ............ 716/136; 716/51; 716/54; 716/100; 716/101; 716/106; 716/110; 716/111; 716/138; 703/13; 703/14; 703/21; 703/25; 703/28; 714/734; 714/735; 714/741; 714/742

(58) Field of Classification Search .................... 716/51, 716/54, 100–101, 106, 110–111, 136, 139; 703/13–25, 28; 714/734–735, 741–742
See application file for complete search history.

(56) References Cited

U.S. PATENT DOCUMENTS

| | | | | |
|---|---|---|---|---|
| 6,484,280 | B1 * | 11/2002 | Moberly | 714/726 |
| 7,197,693 | B2 * | 3/2007 | Hashizume | 714/819 |
| 7,437,692 | B2 * | 10/2008 | Oberlaender | 716/138 |
| 2004/0260531 | A1 * | 12/2004 | Buckley | 703/25 |

OTHER PUBLICATIONS

ISA/EPO, International Search Report and Written Opinion dated Feb. 2, 2009 for PCT/IB2008/053194.
Amory et al., "Software-Based Test for Nonprogrammable Cores in Bus-Based System-On-Chip Architectures," VLSI-SOC: From Systems to Chips, vol. 200, Aug. 16, 2006, pp. 165-179, XP002511160.

(Continued)

*Primary Examiner* — Nghia Doan
(74) *Attorney, Agent, or Firm* — Fenwick & West LLP

(57) ABSTRACT

A system on a chip comprises a plurality of circuit blocks, a programmable processor and a communication circuit. Design information includes connection data including an identification of the direct mutual connection and first and second circuit blocks coupled by the direct mutual connection. An additional register is added to the system on a chip coupled to the direct mutual connection. Verification programs are used includescomprising instructions for the processor to access registers in the second one of the circuit blocks, to use the connection data, or information derived therefrom to select the first one of the circuit blocks, and to issue the standardized call to the interface program of the selected further one of the circuit blocks.

19 Claims, 4 Drawing Sheets

OTHER PUBLICATIONS

Bai et al., "Self-test methodology for at-speed test of crosstalk in chip interconnects," Proceedings 200, Design Automation Conference (IEEE Cat No. 00CH37106), pp. 619-624, XP002511162.

Chen et al., "Embedded software-based self-test for programmable core-based designs," IEEE Design & Test of Computers, vol. 19, No. 4, Jul. 1, 2002, pp. 18-27, XP011094588.

Hollstein et al., "Hinoc: A Hierarchical Generic Approach for on-Chip Communication, Testing and Debugging of SoCs," VLSI-SOC: From Systems to Chips, vol. 200, Aug. 16, 2006, pp. 39-54, XP002511161.

Xu et al., "On reducing wrapper boundary register cells in modular soc testing," Proceedings International test Conference 2003, Sep. 30-Oct. 2, 2003 (International Test Conference), vol. 1, Sep. 30, 2003, pp. 622-631, XP010685255.

* cited by examiner

VERIFICATION OF DESIGN INFORMATION FOR CONTROLLING MANUFACTURE OF A SYSTEM ON A CHIP

FIELD OF THE INVENTION

The invention relates to design verification of an integrated circuit that contains a system on a chip and to an integrated circuit obtained in a way that facilitates design verification.

BACKGROUND OF THE INVENTION

In a typical example, a "system on a chip" is an integrated circuit that comprises a programmable processor and a plurality of circuit blocks with specific functions that will be accessed by the processor. Usually, the circuit blocks have each been designed apart from the context of that integrated circuit. During system design they are selected and combined to realize a specified system. The skilled person commonly refers to such circuit blocks as "IP blocks" (Intellectual Property blocks). The skilled person uses this term both to refer to design information that can be used to implement the circuit block, as well as to refer to the actual circuit block in the physical circuit.

The designers of the system on a chip make a selection of the IP blocks that will be incorporated and their connections. The designers of the system on a chip also have to provide the program for the programmable processor. Typically, the programmable processor is programmed with application software and application interface software for the different IP blocks. The application software is designed by the designers of the system on a chip. The application interface software is designed by the designers of the IP blocks. Usually, the application interface software can be called from (or makes call to) the application software, using a standard application programming interface (API). To give effect to such calls, the application interface software needs to have a "software model" in terms of addresses at which the programmable processor can address each IP block in the system on a chip and optionally also other system parameters of the implementation of the IP block in the system on a chip.

Typically, the design process of the system on a chip starts from a design specification in terms of the functions of the IP blocks used, their functional connection and application functions. This specification is translated in successive stages until it results into a definition of basic circuit components in the integrated circuit. In parallel, the specification is also translated into software. The system parameters used by the software must correspond to the circuit definition that has resulted from the specification.

The huge complexity of many systems on a chip and the participation of many different designers makes the design of such systems very susceptible to errors. This makes it necessary to perform extensive verification of the design. As used herein, verification is a design stage before the physical manufacturing stage of the circuit, aimed at the detection of design errors that, if not corrected, would be present in all manufactured products. In current day design, more than two thirds of integrated circuit implementation effort is involved in verification. It is desirable to reduce this effort.

One type of verification involves the question whether the system parameters that result from the definition of the circuit correspond to the parameters used by the software. This verification potentially addresses both discrepancies between the circuit and software design processes, as well as errors in these processes. It would be desirable to automate this process.

After manufacture, it is known to test manufactured integrated circuits that contain a system on a chip by performing tests of the individual IP blocks and by performing tests of the connections between the IP blocks. The tests of the individual IP blocks are usually defined by the designers of the IP blocks. Such tests may involve structural tests, such as scan tests. Such tests may involve functional tests wherein test data is supplied to an IP block, via a system bus or a special test bus and the response of the IP block is observed.

The tests of the connections between IP blocks may include use of a boundary scan test. US 20040019840 describes testing of connections between logic blocks wherein a signal generating section supplies test signals to outputs of a logic block. Signals from inputs of another logic block, at the other side of the connections, are supplied to a verification circuit. The verification circuit compares the test signals with the signals at the input of the other logic block.

It should be noted that this type of circuit is provided for the purpose of testing manufactured integrated circuits and not for the purpose of verifying the design of the integrated circuit before manufacture. The required test circuitry is usually added after completion of the design, in a way that makes the test circuitry transparent for the designed circuit. For example, boundary scan circuitry typically comprises flip-flops at the input and output pins that are made transparent during normal use. As a result, known test circuitry cannot be used during design verification, simply because it is not present in the design. Even after the test circuitry has been added to the design, conventional test circuitry still cannot be used for verification because it is functionally transparent.

SUMMARY OF THE INVENTION

Among others, it is an object to provide for automated verification of correspondence between the software model of a system on a chip and the circuit that is used to implement the system on a chip.

A system according to claim 1 is provided for manufacturing a system on a chip that contains a processor coupled to a plurality of pre-designed circuit blocks. The circuit blocks may have direct mutual connections that do not run via the processor. Verification of the design is performed using verification programs for execution by the processor. Each verification program is provided for a respective individual circuit block, without knowledge of the context in which it used in the system on a chip. To verify a direct mutual connection to the individual circuit block the verification program refers to connection data in the design of the system on a chip, to identify another circuit block to which the direct mutual connection is coupled and the verification program uses the identification in combination with standardized calls to interface programs of other circuit blocks to access an additional register for capturing or observing signals on the direct mutual connection. In this way, the designer of a circuit block may provide for verification of the connections to the circuit block, without requiring detailed knowledge of the implementation of the circuit blocks.

In an embodiment a circuit simulator is provided that is configured to simulate operation of the system on a chip according to the design information, when operating under control of the verification programs. In this way no physical prototype of the system on a chip is needed to verify the design using the circuit simulator. By using additional registers that are not needed in the original design, observable access to the direct mutual connections can be simulated. In a further embodiment the circuit simulator is configured to simulate operation of the system on a chip according to the design information at respective different levels of abstraction of the circuit blocks. Thus, for example, simulations of a register level model and a transistor level model may be performed to verify design information at different abstraction levels.

In an embodiment integrated circuit manufacturing masks are generated under control of the design information, including the direct mutual connection under control of the connection data. These masks may be used to manufacture the actual system on a chip. This makes it possible to perform verification in the actual system on a chip.

BRIEF DESCRIPTION OF THE DRAWINGS

These and other objects and advantageous aspects will become apparent from a description of exemplary embodiments, which refers to the following Figures.

DETAILED DESCRIPTION OF THE EMBODIMENTS

Figure 1:
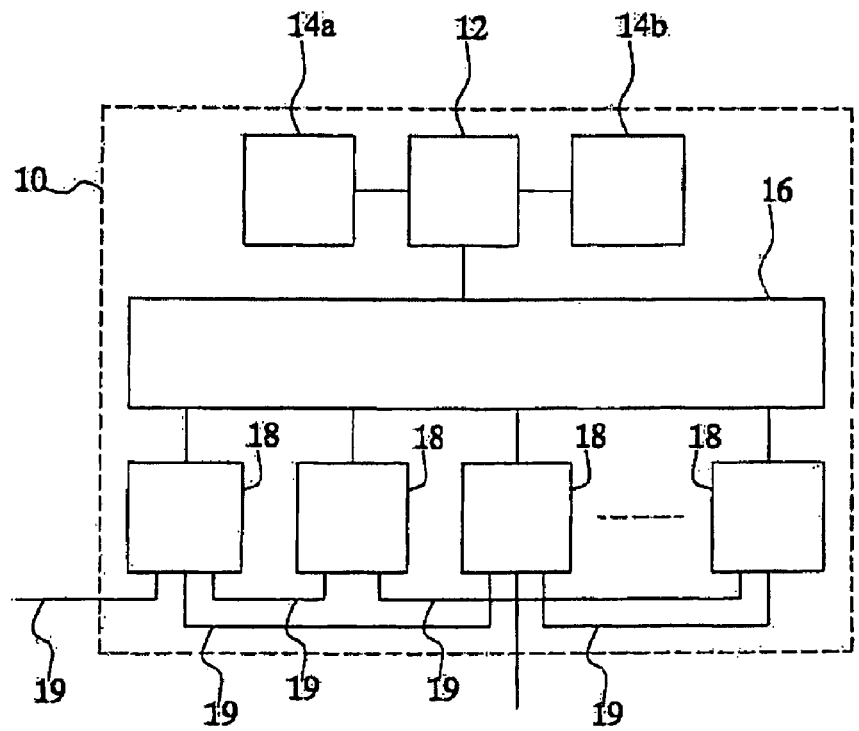
FIG. 1 shows a system on a chip

FIG. 1 shows an embodiment of a system on a chip. The system is implemented in an integrated circuit 10 and the system contains a programmable processor 12, program memory 14a, data memory 14b, a communication circuit 16 and a plurality of circuit blocks, which will be called IP blocks 18. Programmable processor 12 is coupled to IP blocks 18 via communication circuit 16, which may be a bus circuit or, more generally, a communication network. Furthermore, programmable processor 12 is coupled to program memory 14a and data memory 14b. Various direct connections 19 connect pairs of IP blocks 18. Direct connections may also couple IP blocks 18 to external terminals of integrated circuit 10. Furthermore, although not shown, other direct connections may also couple IP blocks 18 to programmable processor 12. Thus, for example, an interrupt controller IP block may have a direct connection to an interrupt input of programmable processor 12. Examples of IP blocks 18 include an interrupt controller circuit, a DMA control circuit, specialized computation circuits, such as a DCT (Digital Cosine Transform) computation circuit etc.

Figure 2:
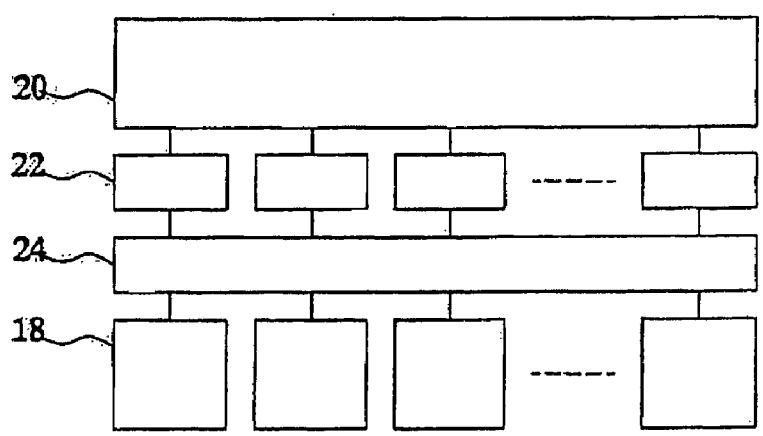
FIG. 2 depicts a software/hardware structure

FIG. 2 depicts software/hardware structure for controlling operation of the system. The software comprises an application layer 20, a plurality of IP block application interface components 22 and a communication layer 24. The software of the layers contains instructions stored in program memory 14a for execution by programmable processor 12. Application layer 20 interacts with IP blocks 18 through application interface components 22, for example by causing programmable processor 12 to transfer control to instructions implemented in application interface components 22, or by providing instructions that programmable processor 12 will start executing in response to calls under control of instructions in the application interface components 22. Instructions from application interface components 22 cause programmable processor 12 to execute instructions from communication layer 24 to control communication circuit 16 to access IP blocks 18. Alternatively, instructions from application interface components 22 may be used to cause programmable processor 12 directly to control communication layer 24 to access IP blocks 18. In the following, for the sake of brevity, execution of instructions from different layers and components by programmable processor 12 will be referred to as actions of the layers and components, with the implicit understanding that they are performed using execution of instructions by programmable processor 12, without explicitly mentioning the involvement of programmable processor 12.

Figure 3B:
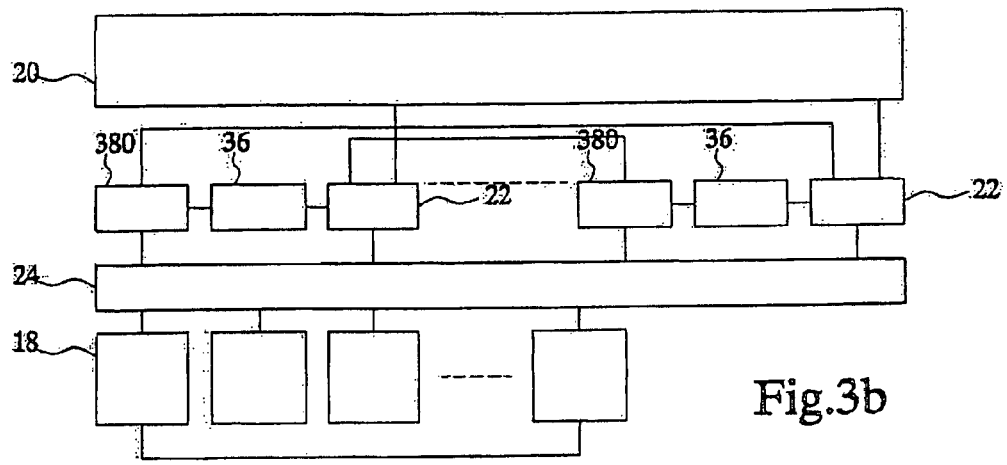
FIG. 3b depicts a software/hardware structure for verification
Figure 3A:
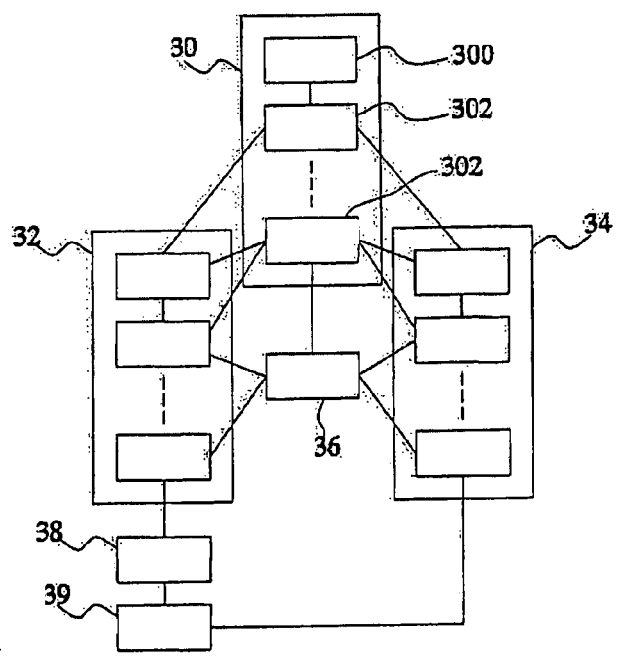
FIG. 3a depicts a design hierarchy

FIG. 3a depicts the structure for converting a design into a concrete integrated circuit. Design data structures are provided on computer readable media. The design data structures include a system design hierarchy 30, a hardware design hierarchy 32, a software design hierarchy 34 and a program model 36. A structure 300 at the highest level in the system design hierarchy 30a specifies the functions performed by the integrated circuit. Successively lower level structures 302 define the system in more detail, by specifying sub-functions and their interrelations (communication of data and control information) that implement functions defined in higher level data structures. This implementation relation is indicated by lines between the data structures 300, 302.

In turn, the combination of the hardware (circuit) design hierarchy 32 and the software design hierarchy 34 implements the system design hierarchy. As in the case of the system design hierarchy 30, these hierarchies comprise data structures of successively lower levels that are related by implementation relations. At the lowest level of the hardware (circuit) design hierarchy 32, a data structure is provided that defines the layout of one or more different layers in an integrated circuit. These data structures are used to manufacture a set of masks 38, which in turn is used to manufacture an integrated circuit 39. At the lowest level of the software design hierarchy 34 is a data structure defining machine instructions for a programmable processor or processors in the integrated circuit. This information may be downloaded into the manufactured integrated circuit 39, or it may be used in the manufacture of the set of masks 38, to define the content of a read only memory (ROM, not shown) in the integrated circuit 39. As an alternative a mix of downloaded and mask defined instructions may be used, part of the instructions being downloaded and another part being entered in ROM.

The generation of the data structures at successively lower levels of the hierarchies may be performed automatically, by design software executed by a computer, or by human designers. Thus for example, programs in high level computer languages are typically written by programmers, whereas conversion of such programs to machine instructions is typically performed by programs, such as compilers.

As in the case of the system hierarchy successively lower level data structures of the hardware (circuit) design hierarchy 32 and the software design hierarchy 34 define the implementation of functions defined by higher level data structures of the hardware and software hierarchy respectively. These implementation relations are indicated by lines between the data structures.

In addition data structures of the hardware (circuit) design hierarchy 32 and the software design hierarchy 34 cooperate to implement functions defined by data structures in the system design hierarchy. Thus for example, specific data and control information produced by the software defined by the software design hierarchy, when running on the hardware defined by the hardware design hierarchy, may implement information defined in the system design hierarchy.

Furthermore, the hardware (circuit) design hierarchy 32 and the software design hierarchy 34 are interrelated by one or more data structures 36 defining a program model. These data structures may define for example hardware addresses at which specific registers of IP blocks in the hardware may be addressed by the software and connections between IP blocks. These data structures may take the form of a database with a set of records including records for respective ones of the circuit blocks, each record defining an identification symbol for the circuit block, the records furthermore having fields for one or more addresses used for the circuit block and for respective terminals of the circuit block, containing identification symbols of other circuit blocks that are coupled to these terminals via direct connections and optionally identifications of terminals of these other circuit blocks. Also, records for direct mutual connections may be provided, with fields containing identification symbols of circuit blocks that are attached to the connections and optionally identifications of terminals of these circuit blocks. Any other form of recording equivalent information may be used. The program model data structure and/or the part of it that represents the connections will be termed connection data.

These data structures are related to the hardware design hierarchy in the sense that the hardware must implement these addresses and connections. These data structures are related to the software design hierarchy in the sense that the software must use these addresses, and operations programmed in the software cause signals to pass along the connections. In part, the program model data structures 36 may implement aspects that are defined in the system design hierarchy 30, part of the program model data structures 36 may in fact be data structures of the system design hierarchy 30, but they will be considered to be part of the program model data structures 36 for the sake of illustration.

As a more particular example, application interface components 22 require program model information about the implementation of the IP blocks 18 in the integrated circuit 10. This program model information may include address information that needs to be supplied to communication circuit 16 to access a specific IP block 18. This address information may take the form of a base address, from which addresses of different registers in the IP block 18 can be determined. Furthermore the program model information may include connection information about the direct connections 19, for example in the form of identifications of terminals of different IP blocks that are connected by the direct connections 19.

Verification of the design process involves a determination that the implementation relations between data structures at the different design levels are met. Known methods are available for doing so within the hardware and software designs hierarchies per se.

However, it is desirable to verify as well that software and hardware cooperate to implement the system design. As will be appreciated the system on a chip will not operate properly if the program model information and the actual circuit implementation are inconsistent with each other. However, as the program model information and the actual circuit implementation are established via different routes during system design, there is no inherent guarantee that they will be consistent. This should be verified at the design stage.

In order to verify the consistency, operation of the designed system on a chip is simulated when it executes instructions of a special verification program. This special verification program uses the same program model information that will be used to execute the application software in the eventual integrated circuit.

FIG. 3b depicts the software structure for verification and application processing. The application layer 20, the application interface components 22 and a communication layer 24 are shown. More specifically, it is shown that the application interface components 22 use the program model data structure 36. This use may be indirect, in the sense that data from the program model data structure 36 may be copied into a data structure that is actually accessed by the application interface components 22, or into program parts. In addition, verification programs 380 are shown, which are coupled to the communication layer 24 and which have access to the program model data structure 36 or copies of data thereof.

In operation the verification programs 380 are executed in a prototype and/or execution of the verification programs 380 is simulated. In the case of simulation, a computer is used to compute the effect that the verification programs 380 would have when they would be executed by hardware (and optionally also software) as specified by data structures in the design hierarchies. The verification programs 380 are designed to produce pass/fail output signals, to indicate whether the IP blocks as designed would implement specified functions of the IP block. Typically, respective individual verification programs 380 for different IP blocks are provided by the designers of the respective IP blocks. These verification programs 380 comprise access instructions to access registers in the IP blocks. These access instructions use information from the program model data structure 36.

In addition, the verification programs 380 may be configured to verify the design of connection between the IP blocks, such as interrupt connections, connections for signal streams, clock signals etc. In order to do so a verification program 380 of a particular IP block is provided with information from the program model data structure 36 that specifies which registers from which other IP block or blocks are coupled to the connections between the particular IP block and the other IP block or blocks. The verification program 380 of the particular IP block contains instructions to access these registers, using calls to the application interface components 22 for the other IP blocks. A standard application programming interface call is used for this, which is standard in the sense that it has calls of the same form for accessing all types of IP block. Only the required identifications differ. These may be passed as parameters of the calls. Thus, the programmer of the verification program 380 of the particular IP block is not required to know the structure or even the identity of the other IP blocks to be able to write the verification program 380 of the particular IP block.

Figure 4:
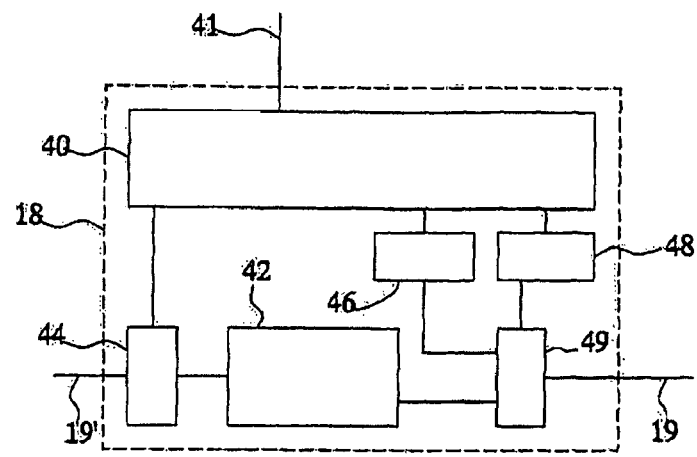
FIG. 4 shows an embodiment of an IP block

FIG. 4 shows an embodiment of the design of an IP block 18 that has been adapted to support the verification. The design of the IP block 18 comprises a communication interface 40, a core 42, an addressable input register 44, an addressable output register 46, an addressable control register 48 and a multiplexer 49. Core 42 comprises functional registers (not shown) and logic and/or analog circuits (not shown). Communication interface 40 is coupled to communication circuit 16 (not shown) via connection 41, to core 42 (e.g. to functional registers in core 42), to addressable input register 44, addressable output register 46 and addressable control register 48. Multiplexer 49 has data inputs coupled to an output of core 42 and to addressable output register 46 and a data output of IP block 18. Addressable control register 48 has an output coupled to a control input of multiplexer 49.

Multiplexer 49 has an output coupled to a direct connection 19 to another circuit block (not shown). Input register 44 is coupled to another direct connection 19' to a further circuit block (or the other circuit block). A first and second circuit block 14 will have an input and an output coupled to a direct connection 19 respectively, with corresponding input and output registers. A circuit block 18 with both an input and an output coupled to direct connections 19 is shown merely by way of example, other circuit blocks may only have an input or only an output coupled to a direct connection.

In embodiment addressable control register 48 also has an output coupled to a control input of addressable input register 44 to switch this register between a transparent mode, for use in normal operation and a clocked capture mode for use during verification. In another embodiment, addressable input register 44 is coupled to a connection from a direct connection 19 to core 42, without logically affecting signals passed to core 42.

Communication interface 40 supports reading and writing from and to functional registers (not shown separately) in core 42, in response to messages received from the programmable processor (not shown) via the communication circuit (not shown). In addition communication interface 40 supports writing to addressable output register 46 and addressable control register 48 in response to messages received from the programmable processor (not shown). Communication interface 40 also supports reading from addressable input register 44 and returning a response message to programmable processor 12 in response to a message received from programmable processor 12.

Thus, communication interface 40 makes it possible for software executed by programmable processor 12 (not shown) to control the output signals of IP block 18 bypassing core 42, by writing the desired output signals to addressable output register 46 and by writing control data into addressable control register 48 to make multiplexer 49 pass data from addressable output register 46. Similarly, communication interface 40 makes it possible for software executed by programmable processor 12 (not shown) to read the input signals of IP block 18 bypassing core 42, by reading from addressable input register 44. This is used for verification. For normal operation core 42 is used to control the output signals and process the input signals. Core is coupled to direct connections 19 to other IP blocks (not shown) via input register 44 and output register 28. By way of example both direct input and output connections are shown, but it should be understood that some or all IP blocks may only have a direct input connection or only a direct output connection. In normal operation the circuit block 18 is switched to a mode wherein signals via direct connections 19 are passed directly without involvement of communication circuit 16, e.g. without need to communicate the signal to communication circuit 16, without requiring allocation of signal lines or other resources in communication circuit 16 etc.

Input register 44 and multiplexer 49 may be coupled to data signal conductors for passing a stream of signal data, such as audio or video sample values, but also to control signal conductors, such as interrupt signal conductors, handshake conductors or even clock signal conductors (running for example from a clock control IP block to different other IP blocks). Input register 44, output register 46, control register 48 and multiplexer 49 make it possible to access these signals from the software at least for the purpose of verification.

The application interface components 22 support access to addressable input register 44, addressable output register 46, and addressable control register 48. For verification the verification program 380 of a particular IP block contains instructions to access these registers in other IP blocks, using calls to the application interface components 22 for another IP block with data from the program model data structure 36 to select the registers that have to be accessed, i.e. the registers that are specified by the program model data structure 36 to be connected to signal conductors from the particular IP block. This is used to observe whether signals generated by the particular IP block arrive at the input register 44 of the other IP block, or to generate a signal from the output register 46 of the other IP block via its multiplexer 49 and to observe whether the signal arrives at the particular IP block.

In addition, the verification program 380 may be configured to access internal functional registers of the particular IP block in order to test its internal functioning. For this purpose the verification program 380 uses the program model data structure 36 to select the registers within the particular IP block. As the programmer of the verification program 380 is assumed to be intimately aware of the structure of the particular IP block this may be done without limiting access to access through application interface components 22. Such direct access enables more detailed testing. Verification program 380 may also contain instructions to access internal registers of the particular IP block in order to observe signals passed to the particular IP block from another IP block in response to register write a command to that other IP blocks in the verification program 380, or to generate signals passed in the particular IP block for observation in another IP block in response to a register read command to that other IP blocks in the verification program 380.

In principle verification may be performed at any level of the design hierarchy, provided that simulation software is provided that is capable of performing simulation based on the design data structure at that level. Thus, abstract (functional) level simulations as well as more detailed level simulation may be performed (e.g. register level or signal level). Verification may even be performed by actual execution in an integrated circuit manufactured using the design hierarchy. In this case the verification programs are loaded into the integrated circuit and executed by the integrated circuit to verify the design. However, more abstract level verification, abstracted from lower level design errors can only be performed by means of simulation.

Although input register 44 may be configured to support only read access, to read signals from direct connection 19, it should be appreciated that it may also be configured to support write access, for example to supply program controlled signals to core 42 during verification. Furthermore, although a circuit block with one input and one output coupled to direct connections 19 is shown, it should be appreciated that any circuit block 18 may have no such connections, or only an input connection, only an output connection or pluralities of such connections to different direct connections 19.

Figure 5:
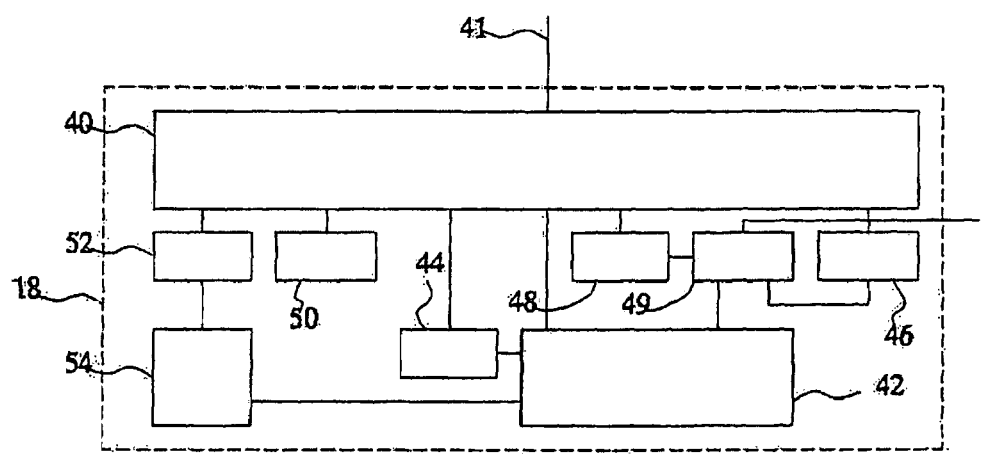
FIG. 5 shows a further embodiment of an IP block

FIG. 5 shows a further embodiment of IP block 18. Herein an addressable dummy register 50, an addressable statistics register 52 and a statistics collector circuit 54 have been added. Dummy register 50 and addressable statistics register 52 are coupled to the communication interface 40, so that communication interface 40 is able to read from addressable statistics register 50 and to read and write and write data from and to addressable dummy register 52.

Dummy register 52 is not connected to any other part of IP block 18. Dummy register 52 serves to enable the programmable processor to read and write to IP block without affecting its operation, in order to test whether its address and data lines are properly connected.

Statistics collector circuit 54 is coupled between core 42 and statistics register 50. Optionally statistics collector circuit 54 is also coupled to communication interface 40. Statistics collector circuit 54 is arranged to detect events that occur in core 42 and/or communication interface 40 and to update statistic data in statistics register 50. The statistic data may comprise a count of events, and/or a plurality of counts of different types of events etc. Detected events may include one or more of detection of an incoming or outgoing message at communication interface 40, detection of an interrupt generated by core 42, detection of DMA transfers executed by communication interface 40, detection of an error, such as an arithmetic overflow during a computation etc. Statistics collector circuit 54 writes or updates one or more counts of such detected events in statistics register 50.

During verification the statistics register 50 may be read using the verification program 380. Similarly dummy register 52 may be used to verify reading and writing using instructions in the verification program.

Although an application of the various registers of FIGS. 4 and 5 to verification has been described, it should be noted that separately these register may also be used in an actual integrated circuit to perform testing, debugging and/or verification of the actual integrated circuit. By providing registers for software access signal lines between IP blocks that are outside the communication circuit normally used by the software, problems in the integrated circuit can be isolated.

Figure 6:
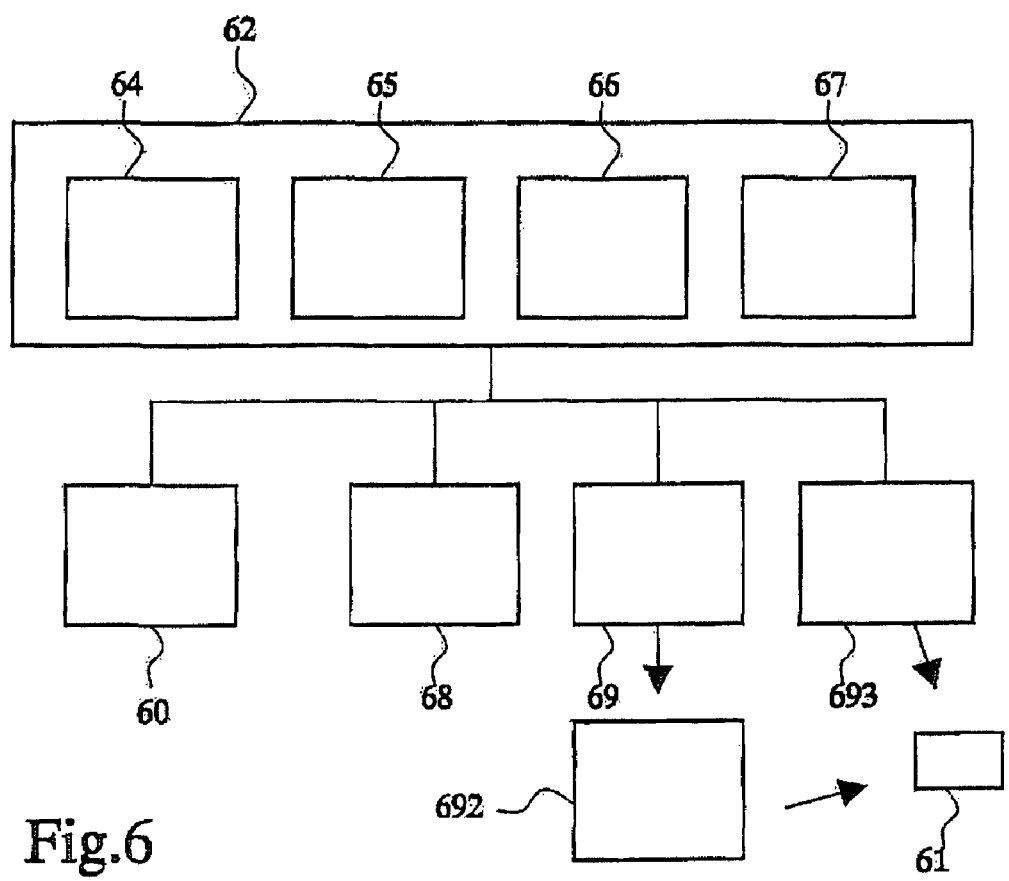
FIG. 6 shows a system for manufacturing a system on a chip

FIG. 6 shows a system for manufacturing a system on a chip. The system for manufacturing the system on a chip 61 comprises a computer 60 and a storage sub-system 62. Storage sub-system 62 may comprise any storage device or combinations of storage devices, such as disk drives, semi-conductor memories etc. Storage sub-system 62 stores a design information data file 64 for controlling manufacture of the system on a chip 61. Typically, a plurality of such files 64 is stored, representing the system at different levels of abstraction and/or parts thereof. Each design information data file directly or indirectly controls manufacture of the system on a chip, for example because it controls the content of a chain of other data files that ultimately control the circuit layout or software that will be used in the system on a chip.

Storage sub-system 62 stores one or more connection data files 65 including an identification of direct mutual connections between circuit blocks in the system on a chip and the circuit blocks involved in such a connection. Furthermore, storage sub-system 62 stores files with interface programs 66 for the processor of the system on a chip, each for accepting access calls according to a same standardized interface to access a respective one of the circuit blocks. Storage sub-system 62 also stores verification computer programs 67, each for a respective one of the circuit blocks. A circuit simulator 68 is provided, which may be part of computer 60, or a separate device. A mask manufacturing device 69 is coupled to storage sub-system 62, for use in IC masks according to the design information, for use in equipment 692 for manufacturing an integrated circuit implementing the system on a chip 61. A software loading device 693 is coupled to storage sub-system 62, for loading interface programs 66 into the system on a chip 61. In an embodiment loading is performed through the manufacture of one or more masks that define the programs in the system on a chip 61.

In operation computer 60 is used to generate design information data files 64, under direction from a user. Circuit simulator 68 is used to simulate the execution of the verification programs 67 by a system defined by the design information and the connection data files. After the simulation has produced satisfactory results eventually mask manufacture and/or software loading is started.

Other variations to the disclosed embodiments can be understood and affected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A system for designing a system on a chip, the system comprising:
a computer configured to:
generate a plurality of interface programs, each interface program configured to enable a processor in the system on a chip to access a register in each of a plurality of circuit blocks in the system on a chip via a communication circuit by having the processor issue a standardized access call to a corresponding circuit block, at least two of the plurality of circuit blocks having a direct connection with each other, wherein the direct connection does not include the communication circuit or the processor;
generate a verification program executable by the processor for verifying operation of one of the at least two circuit blocks having the direct connection, the verification program configured to select another of the at least two circuit blocks having the direct connection and to issue the standardized access call to an interface program associated with the selected circuit block to observe or control a signal via the direct connection; and
monitor operation of the system on a chip during execution of the verification program using the communication circuit.

2. The system according to claim 1, further comprising a circuit simulator configured to simulate operation of the system on a chip according to design information representing a design of the system on a chip.

3. The system according to claim 2, wherein the circuit simulator is further configured to simulate operation of the system on a chip according to the versions of the design information at a plurality of different levels of abstraction of the circuit blocks.

4. The system according to claim 1, further comprising a mask generator configured to generate integrated circuit manufacturing masks based on design information including information on the direct connection.

5. The system according to claim 1, wherein the computer is further configured to execute a design modification program for adding the register to design information of the system on a chip.

6. The system according to claim 1, wherein the one of the at least two circuit blocks comprises an addressable statistics register and a statistics collector circuit, the statistics collector circuit coupled to a core circuit of the circuit block and the statistics register, the statistics collector circuit configured to update a count value in the statistics register in response to events occurring in the core circuit of the circuit block, the statistics register readably coupled to the processor via the communication circuit, the verification program comprising a read instruction addressing the statistics register.

7. The system according to claim 1, wherein the one of the at least two circuit blocks comprises a dummy register readably and writably coupled to the processor via the communication circuit but not to any part of the one of the at least two circuit blocks, the verification program comprising read and write instructions addressing the dummy register.

8. A method of verifying a design information of a system on a chip,
- generating a plurality of interface programs, each interface program configured to enable a processor to access a register in each of a plurality of circuit blocks in the system on a chip via a communication circuit by issuing a standardized access call to a corresponding circuit block, at least two of the plurality of circuit blocks having a direct connection with each other, wherein the direct connection does not include the communication circuit or the processor;
- generating a verification program executable by the processor for verifying operation of one of the at least two circuit blocks having the direct connection, the verification program configured to select another of the at least two circuit blocks having the direct connection and to issue the standardized access call to an interface program associated with the selected circuit block; and
- monitoring operation of the system on a chip during execution of the verification program.

9. The method according to claim 8, wherein said monitoring comprises simulating operation of the system on a chip under control of the verification program.

10. The method according to claim 9, further comprising simulating operation of a plurality of versions of the system on a chip according to the design information under control of the verification program, each version implementing the plurality of circuit blocks of the system on a chip at a different level of abstraction.

11. The method according to claim 8, further comprising manufacturing the system on a chip under control of the design information.

12. The method according to claim 11, further comprising executing the verification program in the manufactured system on a chip.

13. The method according to claim 8, further comprising adding the register to the design information of the system on a chip.

14. The method according to claim 8, further comprising adding an addressable statistics register and a statistics collector circuit to the design of the one of the at least two circuit blocks having the direct connection, the statistics collector circuit coupled to a core circuit of the circuit block and the addressable statistics register, the statistics collector circuit configured to update a count value in the statistics register in response to events occurring in the circuit block, the verification program comprising a read instruction addressing the statistics register.

15. The method according to claim 8, comprising adding an addressable dummy register to the design of the one of the at least two circuit blocks having the direct connection, wherein the addressable dummy register is not coupled to any other part of the one of the at least two circuit blocks, the verification program comprising read and write instructions addressing the dummy register.

16. A system on a chip fabricated using design information, the design verified by a method comprising:
- generating a plurality of interface programs, each interface program configured to enable a processor to access a register in each of a plurality of circuit blocks in the system on a chip via a communication circuit by issuing a standardized access call to a corresponding circuit block, at least two of the plurality of circuit blocks having a direct connection with each other, wherein the direct connection does not include the communication circuit or the processor;
- generating a verification program executable by the processor for verifying operation of one of the at least two circuit blocks having the direct connection, the verification program configured to select another of the at least two circuit blocks having the direct connection and to issue the standardized access call to an interface program associated with the selected circuit block to observe or control a signal via the direct connection; and
- monitoring operation of the system on a chip during execution of the verification program.

17. The system of claim 16, wherein the system is fabricated using masks based on the design information including information on the direct connection.

18. The system according to claim 16, wherein the one of the at least two circuit blocks comprises an addressable statistics register and a statistics collector circuit, the statistics collector circuit coupled to a core circuit of the circuit block and the statistics register, the statistics collector circuit configured to update a count value in the statistics register in response to events occurring in the core circuit of the circuit block, the statistics register readably coupled to the processor via the communication circuit, the verification program comprising a read instruction addressing the statistics register.

19. The system according to claim 16, wherein the one of the at least two circuit blocks comprises a dummy register readably and writably coupled to the processor via the communication circuit but not to any part of the one of the at least two circuit blocks, the verification program comprising read and write instructions addressing the dummy register.

* * * * *

UNITED STATES PATENT AND TRADEMARK OFFICE
CERTIFICATE OF CORRECTION

PATENT NO. : 8,327,309 B2  
APPLICATION NO. : 12/673445  
DATED : December 4, 2012  
INVENTOR(S) : Jan Stuyt et al.

Page 1 of 1

It is certified that error appears in the above-identified patent and that said Letters Patent is hereby corrected as shown below:

In the Claims:

In claim 8, column 11, line 2, after "on a chip," please add --comprising:--.

In claim 9, column 11, line 18, between "block," and "and" please add --to observe or control a signal via the direct connection--.

Signed and Sealed this
Second Day of July, 2013

Teresa Stanek Rea
*Acting Director of the United States Patent and Trademark Office*